US012774537B2

(12) United States Patent
Mu et al.

(10) Patent No.: US 12,774,537 B2
(45) Date of Patent: Oct. 27, 2026

(54) COMPOSITE SILICON CARBIDE SUBSTRATE AND PREPARATION METHOD THEREFOR

(71) Applicant: TJ INNOVATIVE SEMICONDUCTOR SUBSTRATE TECHNOLOGY CO., LTD., Tianjin (CN)

(72) Inventors: Fengwen Mu, Tianjin (CN); Chao Guo, Tianjin (CN)

(73) Assignee: TJ INNOVATIVE SEMICONDUCTOR SUBSTRATE TECHNOLOGY CO., LTD, Tianjin (CN)

( * ) Notice: Subject to any disclaimer, the term of this patent is extended or adjusted under 35 U.S.C. 154(b) by 288 days.

(21) Appl. No.: 18/686,922

(22) PCT Filed: Nov. 24, 2023

(86) PCT No.: PCT/CN2023/133952
§ 371 (c)(1),
(2) Date: Feb. 27, 2024

(87) PCT Pub. No.: WO2024/131439
PCT Pub. Date: Jun. 27, 2024

(65) Prior Publication Data

US 2024/0426026 A1 Dec. 26, 2024

(30) Foreign Application Priority Data

Dec. 21, 2022 (CN) ......................... 202211644873.7

(51) Int. Cl.
*C30B 33/06* (2006.01)
*H10P 14/20* (2026.01)
(Continued)

(52) U.S. Cl.
CPC .............. *C30B 33/06* (2013.01); *H10P 14/24* (2026.01); *H10P 14/2904* (2026.01);
(Continued)

(58) Field of Classification Search
CPC .. H10P 52/00; H10P 14/3458; H10P 14/2904; H10P 14/3408; H10P 14/24; H10P 14/3816; H10P 30/40; C30B 33/06
See application file for complete search history.

(56) References Cited

U.S. PATENT DOCUMENTS 6,258,664 B1 7/2001 Reinberg
2014/0164374 A1* 6/2014 Branson ............ G06F 16/24568 707/736
(Continued)

FOREIGN PATENT DOCUMENTS

CN 104538282 A 4/2015
CN 106489187 A 3/2017
(Continued)

OTHER PUBLICATIONS

Office Action dated Apr. 17, 2024; Taiwanese Patent Application No. 112147537. 7; 5 pages.
(Continued)

*Primary Examiner* — Robert M Kunemund
(74) *Attorney, Agent, or Firm* — McDonald Hopkins LLC

(57) ABSTRACT

Provided are a composite silicon carbide substrate and a preparation method therefor, and the substrate comprises a monocrystalline silicon carbide layer and a silicon carbide support layer; a first doped silicon carbide layer is arranged between the monocrystalline silicon carbide layer and the silicon carbide support layer; a bonding interface layer is arranged between the first doped silicon carbide layer and the monocrystalline silicon carbide layer. The preparation method is: (1) depositing a first doped silicon carbide layer
(Continued)

on the silicon carbide support layer to obtain a first composite layer; (2) bonding the first composite layer obtained in step (1) with a monocrystalline silicon carbide layer treated by ion implantation or laser irradiation, and applying stress to obtain a composite silicon carbide substrate component; and (3) subjecting the composite silicon carbide substrate component obtained in step (2) to a heat treatment to obtain the composite silicon carbide substrate. The composite silicon carbide substrate provided by the present application can reduce or eliminate the resistance of the bonding interface, and the preparation method is simple and efficient and has good controllability.

10 Claims, 2 Drawing Sheets

(51) Int. Cl.
*H10P 14/24* (2026.01)
*H10P 30/40* (2026.01)
*H10P 52/00* (2026.01)

(52) U.S. Cl.
CPC ...... *H10P 14/3408* (2026.01); *H10P 14/3458* (2026.01); *H10P 14/3816* (2026.01); *H10P 30/40* (2026.01); *H10P 52/00* (2026.01)

(56) References Cited

U.S. PATENT DOCUMENTS

2015/0214040 A1* 7/2015 Celler .................. H10P 95/112
438/459
2016/0141412 A1 5/2016 Yen et al.
2017/0073837 A1 3/2017 Honke et al.
2019/0157395 A1 5/2019 Schulze et al.
2019/0288096 A1* 9/2019 Temple ................ H10D 62/199
2020/0006127 A1* 1/2020 Khaderbad ........ H10D 84/0193
2022/0223467 A1 7/2022 Reboh et al.

FOREIGN PATENT DOCUMENTS

| | | | |
|---|---|---|---|
| CN | 108604537 | A | 9/2018 |
| CN | 109478495 | A | 3/2019 |
| CN | 110648977 | A | 1/2020 |
| CN | 111916348 | A | 11/2020 |
| CN | 113658850 | A | 11/2021 |
| CN | 114864529 | A | 8/2022 |
| CN | 114959899 | A | 8/2022 |
| CN | 115261992 | A | 11/2022 |
| CN | 115662881 | A | 1/2023 |
| JP | 2018014372 | A | 1/2018 |
| JP | 2019210162 | A | 12/2019 |
| JP | 2022542224 | A | 9/2022 |
| JP | 2023009025 | A | 1/2023 |
| TW | 202121505 | A | 6/2021 |
| WO | 2018/108006 | A1 | 6/2018 |

OTHER PUBLICATIONS

Office Action dated Feb. 4, 2023; Chinese Patent Application No. 202211644873.7.
Office Action dated Apr. 24, 2025; Japanese Patent No. 2024-514636. 6 pages.
Supplementary European Search Report dated Mar. 24, 2026; European Patent Application No. 23864109.6. 9 pages.

* cited by examiner

COMPOSITE SILICON CARBIDE SUBSTRATE AND PREPARATION METHOD THEREFOR

CROSS-REFERENCE TO RELATED APPLICATIONS

This application is a national stage application filed under 35 U.S.C. 371 based on International Patent Application No. PCT/CN2023/133952 filed on Nov. 24, 2023, which claims priority to Chinese Patent Application No. 202211644873.7 filed on Dec. 21, 2022, the disclosures of which are incorporated herein by reference in their entireties.

TECHNICAL FIELD

The present application relates to the technical field of semiconductor materials, for example, a silicon carbide substrate, and in particular to a composite silicon carbide substrate and a preparation method therefor.

BACKGROUND

The devices made of silicon carbide single crystals have the advantages of high temperature resistance, high voltage resistance, high frequency, high power, radiation resistance and high efficiency, etc., which have an important application value in the fields of radio frequency and new energy.

The conventional manufacturing method for a silicon carbide monocrystalline substrate comprises the following process: a silicon carbide single crystal is grown by physical vapor transport to obtain a crystal ingot of silicon carbide single crystal, the crystal ingot is processed peripherally to obtain a required diameter and surface quality, and then the crystal ingot is cut into a thin sheet, and the thin sheet is ground and polished to a required thickness and flatness to obtain the final silicon carbide monocrystalline substrate. The physical vapor transport has low efficiency in the growth of silicon carbide single crystal, resulting in a high cost of the single silicon carbide monocrystalline substrate.

In order to reduce the cost of the silicon carbide substrates, those skilled in the art propose a composite substrate structure, which is described as follows: a monocrystalline silicon carbide thin layer is bonded on a cheap support substrate. In this solution, a bonding layer is formed between the monocrystalline silicon carbide thin layer and the support substrate, and the presence of the bonding layer may negatively affect the vertical conductivity of the substrate.

In order to reduce or eliminate the resistance of the bonding interface, relevant scholars propose to perform ion implantation on two surfaces to be bonded before the bonding to increase the doping concentration near the surfaces to be bonded, and then perform bonding. This solution can effectively reduce the resistance of the bonding interface, but requires performing ion implantation for many times, so that the preparation process is complicated.

In summary, it has been one of the problems to be solved in this field how to provide a composite substrate which can reduce or eliminate the resistance of the bonding interface, and have a simple and efficient preparation process.

SUMMARY

The following is a summary of the subject described in detail herein. This summary is not intended to limit the protection scope of the claims.

The present application provides a composite silicon carbide substrate and a preparation method therefor. The composite silicon carbide substrate can reduce or eliminate the resistance of the bonding interface, and the preparation method is simple and efficient and has good controllability.

In a first aspect, the present application provides a composite silicon carbide substrate, and the composite silicon carbide substrate comprises a monocrystalline silicon carbide layer and a silicon carbide support layer;

- a first doped silicon carbide layer is arranged between the monocrystalline silicon carbide layer and the silicon carbide support layer;
- a bonding interface layer is arranged between the first doped silicon carbide layer and the monocrystalline silicon carbide layer;
- the first doped silicon carbide layer has a doping concentration of more than or equal to $1\times10^{19}/cm^3$, which can be, for example, $1\times10^{19}/cm^3$, $5\times10^{19}/cm^3$, $1\times10^{20}/cm^3$, $4\times10^{20}/cm^3$, $8\times10^{20}/cm^3$ or $1\times10^{21}/cm^3$. However, the doping concentration is not limited to the listed values, and other unlisted values within the numerical range are also applicable.

The composite silicon carbide substrate provided in the present application further reduces or eliminates the resistance of the bonding interface layer by adding a doped silicon carbide layer, thereby reducing the interfacial conduction loss and heat generation of semiconductor devices manufactured from this substrate.

The doping concentration of the first doped silicon carbide layer in the present application is more than or equal to $1\times10^{19}/cm^3$, and if the doping concentration is too low, the first doped layer cannot effectively reduce or eliminate the resistance of the bonding interface layer.

In the present application, the monocrystalline silicon carbide layer is a high-quality silicon carbide layer, and the silicon carbide support layer is a low-quality silicon carbide layer. A difference between the high-quality and the low-quality lies in the density of defects such as micropipes, dislocations, and carbon inclusions in the silicon carbide crystal, and the defect density in the high-quality silicon carbide layer is less than the defect density in the low-quality silicon carbide layer. The silicon carbide support layer can be polycrystalline. The use of the low-quality silicon carbide layer can reduce the overall cost of the composite substrate without reducing the quality significantly.

As an optional technical solution of the present application, one side of the silicon carbide support layer away from the monocrystalline silicon carbide layer is provided with a second doped silicon carbide layer.

The doped silicon carbide layers can be deposited on the two opposite sides of the silicon carbide support layer in the present application. The simultaneous deposition of the doped silicon carbide layers on the two opposite sides (front and back surfaces) can reduce the substrate deformation in the deposition, and a doped silicon carbide layer existing on the back of the silicon carbide support layer of the final composite substrate can further reduce the ohmic contact resistance of a back electrode manufactured thereon.

In one embodiment, a roughening interface layer is arranged between the silicon carbide support layer and the first doped silicon carbide layer and/or between the silicon carbide support layer and the second doped silicon carbide layer.

The roughening interface layer in the present application can absorb the stress of the composite substrate during the epitaxial growth, reduce the deformation of the composite substrate during the epitaxial growth, and improve the quality of the epitaxial layer.

In one embodiment, a topography of the roughening interface layer comprises an undulating shape and/or a wavy shape.

In one embodiment, the roughening interface layer has an undulating height of 3-500 nm, which can be, for example, 3 nm, 5 nm, 10 nm, 100 nm, 200 nm, 300 nm, 400 nm or 500 nm. However, the undulating height is not limited to the listed values, and other unlisted values within the numerical range are also applicable.

In one embodiment, the monocrystalline silicon carbide layer has a thickness of 0.1-10 μm, which can be, for example, 0.1 μm, 1 μm, 2 μm, 4 μm, 6 μm, 8 μm or 10 μm. However, the thickness is not limited to the listed values, and other unlisted values within the numerical range are also applicable.

In one embodiment, the bonding interface layer has a thickness of 0.5-5 nm, which can be, for example, 0.5 nm, 1 nm, 2 nm, 3 nm, 4 nm or 5 nm. However, the thickness is not limited to the listed values, and other unlisted values within the numerical range are also applicable.

In one embodiment, the silicon carbide support layer has a thickness of 200-1000 μm, which can be, for example, 200 μm, 400 μm, 600 μm, 800 μm or 1000 μm. However, the thickness is not limited to the listed values, and other unlisted values within the numerical range are also applicable.

In one embodiment, the first doped silicon carbide layer has a thickness of 5-50000 nm, which can be, for example, 5 nm, 100 nm, 1000 nm, 10000 nm, 20000 nm, 30000 nm, 40000 nm or 50000 nm. However, the thickness is not limited to the listed values, and other unlisted values within the numerical range are also applicable.

In one embodiment, the second doped silicon carbide layer has a thickness of 5-50000 nm, which can be, for example, 5 nm, 100 nm, 1000 nm, 10000 nm, 20000 nm, 30000 nm, 40000 nm or 50000 nm. However, the thickness is not limited to the listed values, and other unlisted values within the numerical range are also applicable.

In the present application, the thickness of each layer in the composite substrate is limited.

If the thickness of the monocrystalline silicon carbide layer is less than 0.1 μm, the overly small thickness will increase the difficulty and cost of controlling the thickness uniformity, and if the thickness of the monocrystalline silicon carbide layer is more than 10 μm, the overly large thickness will increase the usage amount of the high-quality monocrystalline material as well as the cost.

If the thickness of the bonding interface layer is less than 0.5 nm, the overly small thickness will increase the difficulty and cost of manufacturing, and if the thickness of the bonding interface layer is more than 5 nm, the overly large thickness will increase the resistance of the bonding interface layer, and affect the performance of the semiconductor device manufactured from the substrate.

If the thickness of the silicon carbide support layer is less than 200 μm, the overly small thickness will cause an easy deformation of the support layer, and thus the support layer cannot play a good supporting role, and if the thickness of the silicon carbide support layer is more than 1000 μm, the overly large thickness will increase the amount of the silicon carbide material as well as the cost.

If the thickness of the first/second doped silicon carbide layer is less than 5 nm, the overly small thickness will cause that the first doped layer cannot effectively reduce or eliminate the resistance of the bonding interface layer, and the second doped layer cannot effectively reduce the ohmic contact resistance of the back electrode; if the thickness of the first/second doped silicon carbide layer is more than 50000 nm, the overly large thickness will increase the required time for manufacturing and in turn increase the cost.

In one embodiment, the second doped silicon carbide layer has a doping concentration of more than or equal to $1\times10^{19}/cm^3$, which can be, for example, $1\times10^{19}/cm^3$, $5\times10^{19}/cm^3$, $1\times10^{20}/cm^3$, $4\times10^{20}/cm^3$, $8\times10^{20}/cm^3$ or $1\times10^{21}/cm^3$. However, the doping concentration is not limited to the listed values, and other unlisted values within the numerical range are also applicable.

In one embodiment, a doping element in the first doped silicon carbide layer and the second doped silicon carbide layer comprises any one or a combination of at least two of B, N, P or Al, and a typical but non-limiting combination comprises a combination of B and N, a combination of B and P, a combination of B and Al, a combination of B, N and P, a combination of P, N and Al, or a combination of B, N, P and Al.

In one embodiment, a crystal form of the monocrystalline silicon carbide layer is any one of 4H, 6H or 3C, and optionally, 4H.

In one embodiment, a crystal form of the silicon carbide support layer is any one or a combination of at least two of 4H, 6H or 3C, and a typical but non-limiting combination comprises a combination of 4H and 6H, a combination of 4H and 3C, a combination of 6H and 3C, or a combination of 4H, 6H and 3C.

In one embodiment, the silicon carbide support layer has a doping concentration of more than or equal to $1\times10^{17}/cm^3$, which can be, for example, $1\times10^{17}/cm^3$, $3\times10^{17}/cm^3$, $7\times10^{17}/cm^3$, $1\times10^{18}/cm^3$, $5\times10^{18}/cm^3$, or $9\times10^{18}/cm^3$. However, the doping concentration is not limited to the listed values, and other unlisted values within the numerical range are also applicable.

In one embodiment, the composite silicon carbide substrate has a diameter of 2-8 inches, which can be, for example, 2 inches, 4 inches, 6 inches or 8 inches. However, the diameter is not limited to the listed values, and other unlisted values within the numerical range are also applicable.

In a second aspect, the present application provides a preparation method for the composite silicon carbide substrate according to the first aspect, and the preparation method comprises the following steps:

(1) depositing a first doped silicon carbide layer on the silicon carbide support layer to obtain a first composite layer;
(2) bonding the first composite layer obtained in step (1) with a monocrystalline silicon carbide layer treated by ion implantation or laser irradiation, and applying stress to obtain a composite silicon carbide substrate component; and
(3) subjecting the composite silicon carbide substrate component obtained in step (2) to a heat treatment to obtain the composite silicon carbide substrate.

In one embodiment, the deposition in step (1) comprises chemical vapor deposition or liquid phase epitaxy.

In the chemical vapor deposition of the present application, a reactive gas is utilized to react in a high-temperature reaction chamber to grow a high-doped silicon carbide layer on the surface of a low-quality silicon carbide substrate. The reactive gas at least comprises a silicon source gas, a carbon source gas and a doping gas; the silicon source gas can be any one or a combination of at least two of silane, trichlorosilane, tetrachlorosilane or dichlorosilane; the carbon source gas can be any one or a combination of at least two of ethylene, propane or acetylene; the doping gas is generally nitrogen.

The liquid phase epitaxy is: a silicon-containing fluxing agent is placed in a graphite crucible, and melted by heating, and carbon in the graphite crucible is dissolved into the fluxing agent; then the surface of the low-quality silicon carbide substrate is contacted or impregnated with a fluxing solution, and due to the supercooling of the surface of the silicon carbide substrate, the carbon is precipitated on a solid-liquid interface of the silicon carbide substrate, and combines with silicon in the fluxing agent to form a high-doped silicon carbide layer. Nitrogen is introduced into the reaction chamber to achieve the doping, or the fluxing agent is added with metal elements such as Al to achieve the doping.

In one embodiment, the deposition in step (1) further comprises that a second doped silicon carbide layer is deposited on one side of the silicon carbide support layer away from the first doped silicon carbide layer.

In one embodiment, the preparation method further comprises a roughening treatment before the deposition in step (1).

In one embodiment, the roughening treatment comprises chemical etching and/or plasma etching.

The chemical etching in the present application is wet etching.

In one embodiment, a surface treated by the roughening treatment has an undulating height of 3-500 nm, which can be, for example, 3 nm, 5 nm, 10 nm, 100 nm, 200 nm, 300 nm, 400 nm or 500 nm. However, the undulating height is not limited to the listed values, and other unlisted values within the numerical range are also applicable.

In one embodiment, an ion used in the ion implantation of step (2) comprises a hydrogen ion and/or a helium ion.

In one embodiment, the ion implantation has a depth of less than or equal to 5 μm, which can be, for example, 5 μm, 4 μm, 3 μm, 2 μm or 1 μm. However, the depth is not limited to the listed values, and other unlisted values within the numerical range are also applicable.

In one embodiment, laser used in the laser irradiation of step (2) comprises pulsed laser.

In one embodiment, the pulsed laser comprises solid-state laser or fiber laser.

In one embodiment, the laser irradiation in step (2) has a pulse width of 100-300 fs, which can be, for example, 100 fs, 140 fs, 180 fs, 220 fs, 260 fs or 300 fs. However, the pulse width is not limited to the listed values, and other unlisted values within the numerical range are also applicable.

In one embodiment, the laser irradiation in step (2) has a depth of less than or equal to 150 μm, which can be, for example, 150 μm, 140 μm, 130 μm, 120 μm, 110 μm or 100 μm. However, the depth is not limited to the listed values, and other unlisted values within the numerical range are also applicable.

An object of the ion implantation or the laser irradiation is to form a weakened layer at a certain depth from the surface of ion implantation or laser irradiation in the monocrystalline silicon carbide layer.

In one embodiment, a bonding interface layer is obtained after the bonding in step (2).

In one embodiment, the preparation method further comprises performing a pretreatment process on a surface to be bonded before the bonding in step (2).

In one embodiment, the pretreatment process comprises grinding and polishing which are performed in sequence.

In one embodiment, the surface to be bonded after the polishing has a roughness of 0.05-0.5 nm, which can be, for example, 0.05 nm, 0.1 nm, 0.2 nm, 0.3 nm, 0.4 nm or 0.5 nm. However, the roughness is not limited to the listed values, and other unlisted values within the numerical range are also applicable.

In one embodiment, a manner of the stress application in step (2) comprises a heat treatment or mechanical separation.

In one embodiment, when the manner of the stress application in step (2) is the heat treatment, the heat treatment is performed at a temperature of 700-1300° C., which can be, for example, 700° C., 800° C., 900° C., 1000° C., 1100° C., 1200° C. or 1300° C. However, the temperature is not limited to the listed values, and other unlisted values within the numerical range are also applicable.

An object of applying stress is to split the monocrystalline silicon carbide layer along the weakened layer so as to divide the monocrystalline silicon carbide layer into two parts: a to-be-recovered layer and a monocrystalline silicon carbide layer on the composite silicon carbide substrate.

In one embodiment, the heat treatment in step (3) is performed at a temperature of 1500-1900° C., which can be, for example, 1500° C., 1600° C., 1700° C., 1800° C. or 1900° C. However, the temperature is not limited to the listed values, and other unlisted values within the numerical range are also applicable.

In one embodiment, the heat treatment in step (3) is performed for a period of 10-10000 s, which can be, for example, 10 s, 100 s, 1000 s, 5000 s or 10000 s. However, the period is not limited to the listed values, and other unlisted values within the numerical range are also applicable.

An object of the heat treatment in step (3) is to repair a damage of the bonding interface layer, and to reduce or eliminate a resistance introduced by the bonding interface layer.

Before the heat treatment in step (3) of the present application, a layer of carbon film or diamond-like carbon film with a thickness of 30-600 nm can be deposited on the surface of the composite substrate by using publicly known technologies for preventing the sublimation and evaporation of silicon on the surface.

The numerical ranges in the present application comprise not only the above listed point values, but also any unlisted point value within the above numerical ranges, and for reasons of space and brevity, the specific point values comprised in the ranges will not be listed exhaustively in the present application.

Compared with the related art, the present application has the following beneficial effects.

(1) The composite silicon carbide substrate provided in the present application can effectively reduce or eliminate the resistance of the bonding interface layer.

(2) For the composite silicon carbide substrate provided in the present application, the simultaneous deposition of the doped silicon carbide layers on the two opposite sides of the silicon carbide support layer can reduce the substrate deformation during the deposition, and the second doped silicon carbide layer existing on the back of the silicon carbide support layer of the final composite substrate can further reduce the ohmic contact resistance of a back electrode manufactured thereon.

(3) The roughness interface layer of the composite silicon carbide substrate provided in the present application can absorb the stress of the composite substrate during the epitaxial growth, reduce the deformation of the composite substrate during the epitaxial growth, and improve the quality of the epitaxial layer.

After accompanying drawings and detailed description are read and understood, other aspects can be understood.

BRIEF DESCRIPTION OF DRAWINGS

Accompanying drawings are used to provide a further understanding of the technical solutions herein, form part of the specification, explain the technical solutions together with examples of the present application, and do not limit the technical solutions herein.

Reference list: 1—silicon carbide support layer; 2—first doped silicon carbide layer; 3—monocrystalline silicon carbide layer; 4—second doped silicon carbide layer; 300—weakened layer; and 31—to-be-recovered layer.

DETAILED DESCRIPTION

The technical solutions of the present application are further explained by the embodiments below. Those skilled in the field should understand that the examples merely assist in understanding the present application and should not be regarded as a specific limitation to the present application.

Example 1

Figure 1:
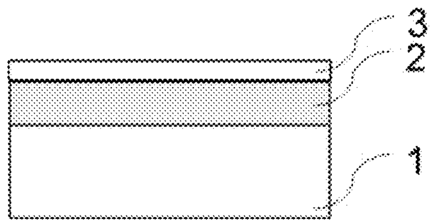
FIG. 1 is a schematic structural diagram of the composite silicon carbide substrate provided in Example 1 of the present application.

This example provides a composite silicon carbide substrate as shown in FIG. 1, and the composite silicon carbide substrate comprises a monocrystalline silicon carbide layer 3 and a silicon carbide support layer 1;

a first doped silicon carbide layer 2 is arranged between the monocrystalline silicon carbide layer 3 and the silicon carbide support layer 1;

a bonding interface layer is arranged between the first doped silicon carbide layer 2 and the monocrystalline silicon carbide layer 3;

the first doped silicon carbide layer 2 has a doping concentration of $1.2\times10^{20}/cm^3$.

The monocrystalline silicon carbide layer has a thickness of 1.5 μm; the bonding interface layer has a thickness of 2 nm; the silicon carbide support layer has a thickness of 345 μm; the first doped silicon carbide layer has a thickness of 5 μm.

A doping element in the first doped silicon carbide layer is N; a crystal form of the monocrystalline silicon carbide layer 3 is 4H; the silicon carbide support layer 1 is a polycrystal with a crystal form of 3C.

The composite silicon carbide substrate has a diameter of 6 inches.

Figure 3:
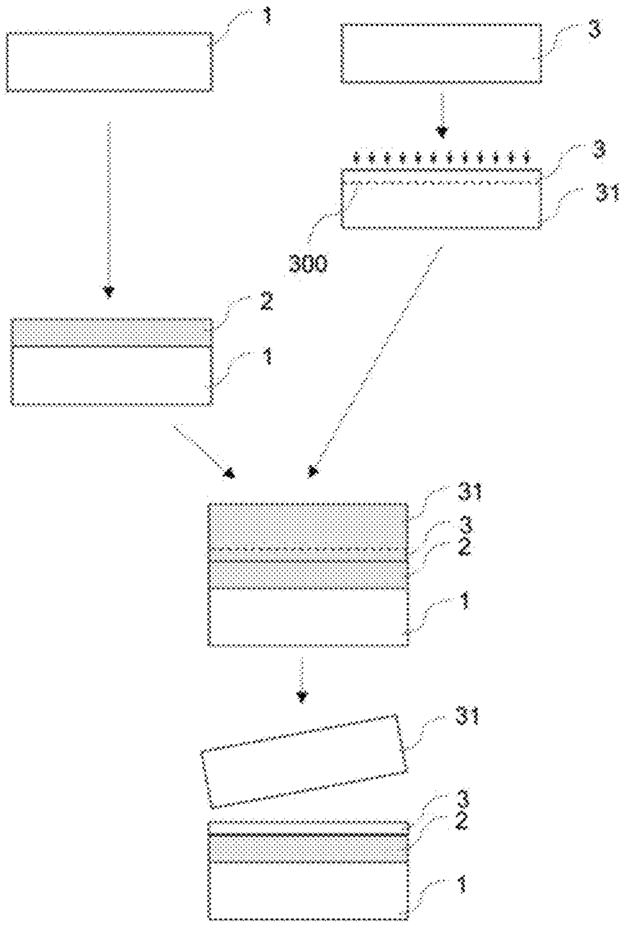
FIG. 3 is a flow chart showing the preparation of the composite silicon carbide substrate provided in Example 1 of the present application.

The flow chart showing the preparation of the composite silicon carbide substrate for a preparation method for the composite silicon carbide substrate is shown in FIG. 3, which specifically comprises the following steps:

(1) a first doped silicon carbide layer 2 was deposited on the silicon carbide support layer 1 to obtain a first composite layer;

(2) the first composite layer obtained in step (1) was bonded with a monocrystalline silicon carbide layer 3 treated by ion implantation, and applied with stress to obtain a composite silicon carbide substrate component; and (3) the composite silicon carbide substrate component obtained in step (2) were subjected to a heat treatment at 1600° C. for 10-10000 s to obtain the composite silicon carbide substrate.

In the preparation method, a weakened layer 300 was formed inside the monocrystalline silicon carbide layer 3 during the ion implantation in step (2). After the stress was applied, the monocrystalline silicon carbide layer was split along the weakened layer 300 to divide the monocrystalline silicon carbide layer 3 into two parts: a to-be-recovered layer 31 and a monocrystalline silicon carbide layer on the composite silicon carbide substrate: a depth of the ion implantation was 1.5 μm;

the to-be-recovered layer 31 can be recycled and reused to repeat the preparation method of the composite substrate.

Example 2

Figure 2:
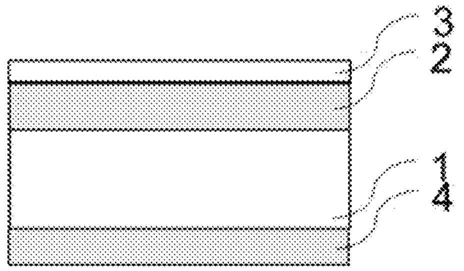
FIG. 2 is a schematic structural diagram of the composite silicon carbide substrate provided in Example 2 of the present application.

This example provides a composite silicon carbide substrate as shown in FIG. 2, and the composite silicon carbide substrate differs from Example 1 only in that:

in this example, a second doped silicon carbide layer 4 is deposited on the back of the silicon carbide support layer 1; and the second doped silicon carbide layer 4 has a thickness of 5 μm.

Figure 4:
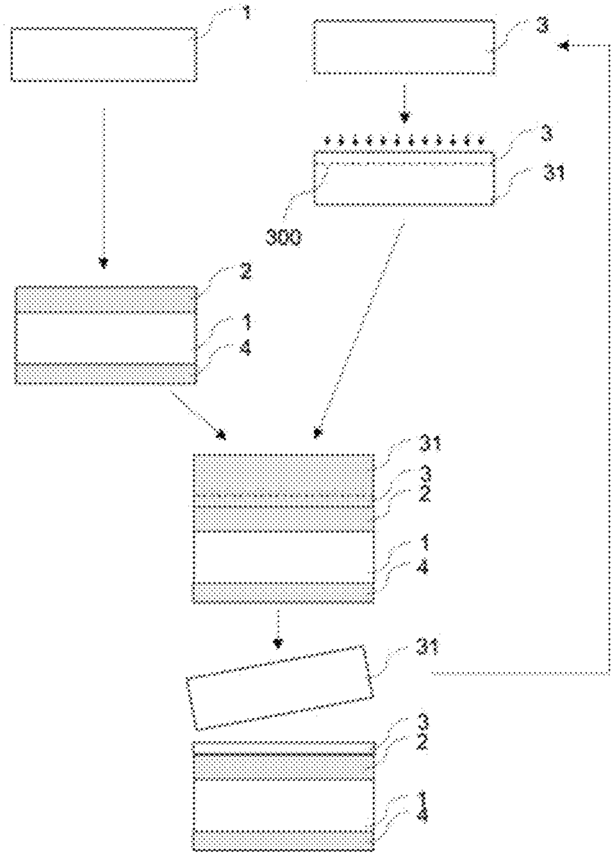
FIG. 4 is a flow chart showing the preparation of the composite silicon carbide substrate provided in Example 2 of the present application.

A preparation method for the composite silicon carbide substrate in this example differs from Example 1 only in that:

in this example, the deposition of the first doped silicon carbide layer 2 on the silicon carbide support layer 1 in step (1) was changed to the simultaneous deposition of the first doped silicon carbide layer 2 and the second doped silicon carbide layer 4 on the silicon carbide support layer 1, as shown in FIG. 4; and the second doped silicon carbide layer was arranged on one side of the silicon carbide support layer 1 away from the first doped silicon carbide layer 2.

Example 3

This example provides a composite silicon carbide substrate, and the composite silicon carbide substrate differs from Example 1 only in that:

in this example, a wavy-shaped roughening interface layer is arranged between the silicon carbide support layer 1 and the first doped silicon carbide layer 2, and the roughening interface layer has an undulating height of 200 nm.

A preparation method for the composite silicon carbide substrate differs from Example 1 only in that:

in this example, the surface to be deposited of the silicon carbide support layer 1 was roughened before the deposition in step (1).

Example 4

This example provides a composite silicon carbide substrate, and the composite silicon carbide substrate differs from Example 2 only in that:

in this example, a wavy-shaped roughening interface layer is independently arranged between the silicon carbide support layer 1 and the first doped silicon carbide layer 2 and between the silicon carbide support layer 1 and the second doped silicon carbide layer 4; the roughening interface layer has an undulating height of 200 nm.

A preparation method for the composite silicon carbide substrate differs from Example 2 only in that:

in this example, the surface to be deposited of the silicon carbide support layer 1 was roughened before the deposition in step (1).

Comparative Example 1

This comparative example provides a composite silicon carbide substrate, and the composite silicon carbide substrate differs from Example 1 only in that:

in this comparative example, the first doped silicon carbide layer 2 is omitted and the silicon carbide support layer has a thickness of 350 μm.

A thickness of the monocrystalline silicon carbide layer and a thickness of the bonding interface layer are the same as in Example 1.

A preparation method for the composite silicon carbide substrate differs from Example 1 only in that:

the deposition process in step (1) was omitted in this comparative example.

Performance Test (1) Interface resistance comparison of composite silicon carbide substrates provided in Examples 1-4 and Comparative Example 1

A measurement method of the interface resistance is as follows: a back electrode is formed on the surface of the polycrystalline substrate of the composite silicon carbide substrate, and a circular surface electrode with a diameter of 0.3 mm is formed on the surface of the monocrystalline layer. A voltage V is applied to the surface electrode and the back electrode, the corresponding current I is recorded to obtain a V-I curve, and the resistance value is calculated.

(2) Shape characterization, i.e., BOW and WARP: the BOW value represents a bowing degree of the shape, and the WARP value represents a warping degree of the shape;

The deformation degrees of the composite substrates provided in Examples 1-4 and Comparative Example 1 in the epitaxial process are compared, and an epitaxial thickness is 15 μm. The shape of the epitaxial substrate is measured after the epitaxy is finished to obtain the BOW value and WARP value, which are compared with those before the epitaxy to calculate the absolute value of the variation.

The result of the performance test in the present application is shown in Table 1.

TABLE 1

| | Resistance/Ω | Absolute value of variation in BOW/μm | Absolute value of variation in WARP/nm |
|---|---|---|---|
| Example 1 | 3.9 | 12.5 | 9.8 |
| Example 2 | 3.8 | 14.1 | 12.7 |
| Example 3 | — | 7.9 | 6.7 |
| Example 4 | — | 11.0 | 8.4 |
| Comparative Example 1 | 4.1 | — | — |

By analyzing Table 1, it can be seen from the comparison of the resistance values of Examples 1-2 and Comparative Example 1 that the doped silicon carbide layer in the composite silicon carbide substrate of the present application can effectively reduce the interface resistance of the bonding interface in the composite substrate, and simultaneously reduce the ohmic contact resistance of the back electrode of the composite substrate;

it can be seen from the comparison of the absolute values of variation in BOW and WARP in Examples 1 and 3 and Examples 2 and 4 that the roughening interface layer can effectively reduce the deformation of the composite substrate during the epitaxial process.

In summary, the composite silicon carbide substrate provided in the present application can reduce or eliminate the interface resistance of the bonding interface in the composite substrate, reduce the ohmic contact resistance of the back electrode in the composite substrate, and reduce the deformation of the composite substrate in the epitaxial process, and the preparation method is simple and efficient and has good controllability.

The applicant declares that the above is only embodiments of the present application, but the protection scope of the present application is not limited thereto. It should be understood by those skilled in the art that any change or replacement that can be easily thought of within the technical scope disclosed by the present application shall fall within the protection scope and disclosure scope of the present application.

What is claimed is:

1. A composite silicon carbide substrate, comprising a monocrystalline silicon carbide layer and a silicon carbide support layer;

a first doped silicon carbide layer is arranged between the monocrystalline silicon carbide layer and the silicon carbide support layer;

a bonding interface layer is arranged between the first doped silicon carbide layer and the monocrystalline silicon carbide layer;

the first doped silicon carbide layer has a doping concentration of more than or equal to $1\times10^{19}/cm^3$;

wherein one side of the silicon carbide support layer away from the monocrystalline silicon carbide layer is provided with a second doped silicon carbide layer;

a roughening interface layer is arranged between the silicon carbide support layer and the first doped silicon carbide layer and/or between the silicon carbide support layer and the second doped silicon carbide layer.

2. The composite silicon carbide substrate according to claim 1, wherein a topography of the roughening interface layer comprises an undulating shape and/or a wavy shape;

the roughening interface layer has an undulating height of 3-500 nm.

3. The composite silicon carbide substrate according to claim 2, wherein the monocrystalline silicon carbide layer has a thickness of 0.1-10 μm;

the bonding interface layer has a thickness of 0.5-5 nm;
the silicon carbide support layer has a thickness of 200-1000 μm;
the first doped silicon carbide layer has a thickness of 5-50000 nm;
the second doped silicon carbide layer has a thickness of 5-50000 nm.

4. The composite silicon carbide substrate according to claim 3, wherein a doping element in the first doped silicon carbide layer and the second doped silicon carbide layer comprises any one or a combination of at least two of B, N, P or Al;
a crystal form of the monocrystalline silicon carbide layer is any one of 4H, 6H or 3C;
a crystal form of the silicon carbide support layer is any one or a combination of at least two of 4H, 6H or 3C;
the silicon carbide support layer has a doping concentration of more than or equal to $1\times10^{17}/cm^3$;
the composite silicon carbide substrate has a diameter of 2-8 inches.

5. A preparation method for the composite silicon carbide substrate according to claim 1, comprising the following steps:
(1) depositing a first doped silicon carbide layer on the silicon carbide support layer to obtain a first composite layer;
(2) bonding the first composite layer obtained in step (1) with a monocrystalline silicon carbide layer treated by ion implantation or laser irradiation, and applying stress to obtain a composite silicon carbide substrate component; and
(3) subjecting the composite silicon carbide substrate component obtained in step (2) to a heat treatment to obtain the composite silicon carbide substrate.

6. The preparation method according to claim 5, wherein the deposition in step (1) comprises chemical vapor deposition or liquid phase epitaxy;
the deposition in step (1) further comprises depositing a second doped silicon carbide layer on one side of the silicon carbide support layer away from the first doped silicon carbide layer.

7. The preparation method according to claim 5, wherein the preparation method further comprises a roughening treatment before the deposition in step (1);
the roughening treatment comprises chemical etching and/or plasma etching;
a surface treated by the roughening treatment has an undulating height of 3-500 nm.

8. The preparation method according to claim 5, wherein an ion used in the ion implantation of step (2) comprises a hydrogen ion and/or a helium ion;
the ion implantation has a depth of less than or equal to 5 μm;
laser used in the laser irradiation of step (2) comprises pulsed laser;
the pulsed laser comprises solid-state laser or fiber laser;
the laser irradiation in step (2) has a pulse width of 100-300 fs;
the laser irradiation in step (2) has a depth of less than or equal to 150 μm.

9. The preparation method according to claim 5, wherein a bonding interface layer is obtained after the bonding in step (2);
the preparation method further comprises performing a pretreatment process on a surface to be bonded before the bonding in step (2);
the pretreatment process comprises grinding and polishing which are performed in sequence;
the surface to be bonded after the polishing has a roughness of 0.05-0.5 nm.

10. The preparation method according to claim 5, wherein a manner of the stress application in step (2) comprises a heat treatment or mechanical separation;
in a case where the manner of the stress application in step (2) is the heat treatment, the heat treatment is performed at a temperature of 700-1300° C.;
the heat treatment in step (3) is performed at a temperature of 1500-1900° C.;
the heat treatment in step (3) is performed for a period of 10-10000 s.

* * * * *